United States Patent [19]

Cho et al.

[11] 4,434,383
[45] Feb. 28, 1984

[54] TEMPERATURE STABLE SURFACE ACOUSTIC WAVE DEVICE

[75] Inventors: Frederick Y. Cho, Scottsdale, Ariz.; Dylan F. Williams, Berkeley, Calif.

[73] Assignee: Motorola Inc., Schaumburg, Ill.

[21] Appl. No.: 457,081

[22] Filed: Jan. 10, 1983

Related U.S. Application Data

[63] Continuation-in-part of Ser. No. 232,611, Feb. 9, 1981.

[51] Int. Cl.³ .............................................. H01L 41/08
[52] U.S. Cl. ................................ 310/313 R; 310/346; 310/313 D; 333/155
[58] Field of Search .......... 310/313 R, 313 A, 313 B, 310/313 C, 313 D, 346; 333/155; 331/41, 176

[56] References Cited

U.S. PATENT DOCUMENTS

| | | | |
|---|---|---|---|
| 3,772,618 | 11/1973 | Slobodnik, Jr. | 333/155 |
| 3,786,373 | 1/1974 | Shulz | 333/155 |
| 3,999,147 | 12/1976 | Otto et al. | 331/176 X |
| 4,166,228 | 8/1979 | Solie | 310/313 D |
| 4,193,045 | 3/1980 | Houkawa et al. | 310/315 |
| 4,272,742 | 6/1981 | Lewis | 333/155 |
| 4,325,038 | 4/1982 | Coldren | 333/155 X |

Primary Examiner—Mark O. Budd
Attorney, Agent, or Firm—Jonathan P. Meyer; Eugene A. Parsons

[57] ABSTRACT

A temperature stable surface acoustic wave device utilizes a known variation in the power flow angle characteristic of the substrate over a temperature range to vary the response of the device at one or more output transducers in a way which compensates for temperature dependent phase shifts common to prior art devices.

9 Claims, 14 Drawing Figures

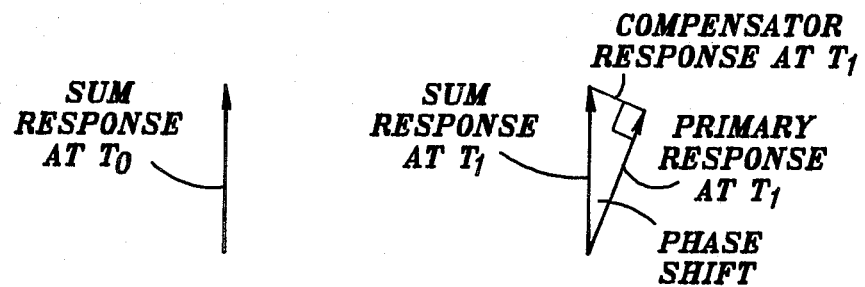
FIG. 4A
FIG. 4B
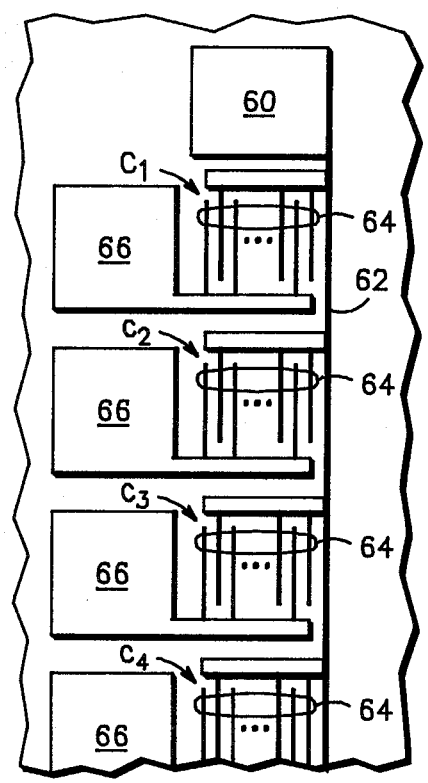
FIG. 5A

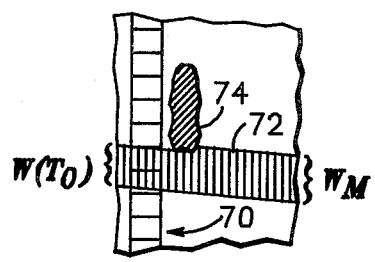
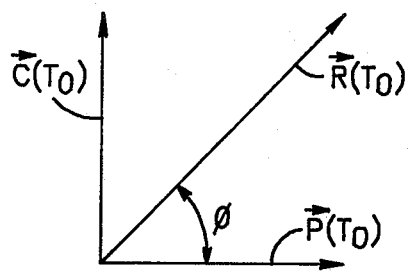
*FIG. 6A*     *FIG. 6B*
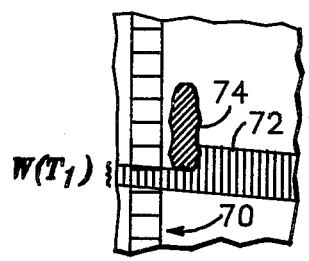
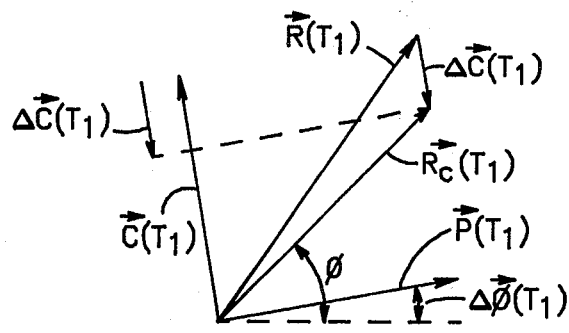
*FIG. 7A*     *FIG. 7B*
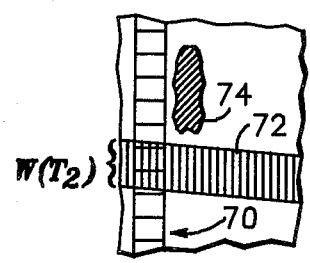
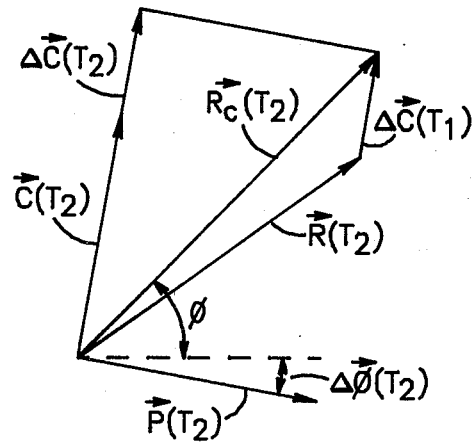
*FIG. 8A*
*FIG. 8B*

TEMPERATURE STABLE SURFACE ACOUSTIC WAVE DEVICE

This invention was accomplished under contract with the U.S. Government. The terms of that contract specify that the contractor retains title to the invention and the U.S. Government is granted a non-exclusive license to practice the invention. This application is a continuation-in-part of Ser. No. 232,611, filed Feb. 9, 1981.

BACKGROUND OF THE INVENTION

Surface Acoustic Wave (SAW) devices are well known as useful signal processing elements in radio frequency circuits. Such devices are generally fabricated by conventional photolithographic techniques on a crystal substrate capable of supporting acoustic waves on its surface. Metal film transducers are used to transform electrical signals to acoustic waves and vice versa. A signal present at an input transducer will generate acoustic waves which will travel over the surface of the substrate and generate an electrical response in an output transducer located at some distance from the input transducer. One useful function of SAW devices is providing precisely determined delays in RF circuits. Detailed knowledge of the propagation of surface acoustic waves and precise manufacturing techniques allow very precise delay lines to be constructed with SAW devices.

However, if such delay services are subjected to temperature excursions during operation, the temperature dependent properties of the crystal structure cause variation in the phase of the response of the SAW device. Since this phenomenon seriously effects the utility of SAW devices in many applications, various attempts have been made to design temperature stable SAW devices. For example, U.S. Pat. No. 3,943,389, which is assigned to the assignee of the present invention, presents a method of physically constraining the substrate from changes in dimension. This is a multi-layer device which involves increased manufacturing costs. Another approach is discussed in "A Novel Technique for Improving the Temperature Stability of SAW/SSBW Devices", T. I. Browning and M. F. Lewis, 1978 IEEE USP (CH-1344-1), pp. 474–477. This involves the use of multiple propagation paths aligned along different directions across the substrate, carefully balanced to provide a summed response which is relatively temperature stable. Again, this is a complex system requiring exacting manufacturing techniques.

The notation for crystal cuts used herein will conform to the standard set out in "Standards on Piezoelectric Crystals 1949", Proc. IRE 24, Dec. 1949, pp. 1378–1395.

SUMMARY OF THE INVENTION

Accordingly, it is an object of this invention to provide an improved temperature stable SAW device.

It is a further object to utilize temperature dependent characteristics of surface acoustic wave propagation in combination with unique output transducer design to achieve temperature stable response.

This invention utilizes the fact that the power flowing in surface acoustic waves is directed along a path angle which varies predictably with temperature. A unique feature of this invention involves the use of output transducers of special design which take advantage of the changing direction of power flow to compensate for temperature variations in device response.

These and other objects and advantages of the invention will be apparent from the detailed description below.

DESCRIPTION OF THE DRAWINGS

FIGS. 4A and 4B are phase diagrams related to the embodiment of FIG. 3;

FIG. 5A is a plan view on an expanded scale of a portion of one of the transducers of FIG. 5;

FIG. 6A is a diagram of a portion of a SAW device according to the present invention at a temperature $T_0$;

FIG. 6B is a phase diagram corresponding to FIG. 6A;

FIG. 7A is a diagram of a portion of a SAW device according to the present invention at a temperature $T_1$;

FIG. 7B is a phase diagram corresponding to FIG. 7A;

FIG. 8A is a diagram of a portion of a SAW device according to the present invention at a temperature $T_2$;

FIG. 8B is a phase diagram corresponding to FIG. 8A; and

DETAILED DESCRIPTION OF THE INVENTION

Figure 1:
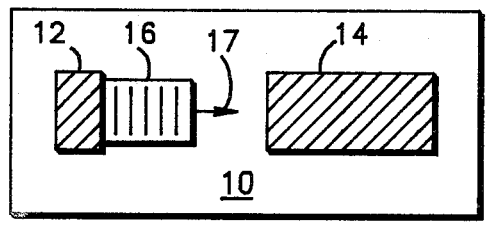
FIG. 1 is a diagram of a SAW device typical of the prior art.

The present invention relates to Surface Acoustic Wave (SAW) devices, which may be best understood in basic principle by reference to FIG. 1. The characteristics of any SAW device are determined largely by the choice of substrate 10. This may be a single piezoelectric crystal, or a laminate of several substances. The choice of substrate 10 is made according to criteria well known in the art having to do with the characteristics of surface wave propagation. Surface wave beam 16 is generated by application of a varying electric signal from an external circuit to input transducer 12, which is generally a metal film applied by well known techniques. Throughout this application, conventional, interdigitated SAW transducers are indicated by shaded blocks (e.g. 12 and 14). Many variations such as weighted and double electrodes may be used, as will be apparent. The power of beam 16 will flow in direction 17 toward output transducer 14. When beam 16 reaches output transducer 14, an electrical response is generated which may be applied to an external circuit. The utility of SAW devices used as delay lines depends upon the precision and stability with which the delay time between input signal and output response can be designed into the device. The propagation characteristics of surface waves are dependent on the crystal constants of substrate 10 and, therefore, are dependent on temperature. As a result, the phase of the response of the device to a constant input signal will be seen to shift if the temperature of the device changes. It is an object of this invention to compensate for this temperature instability.

A property of the particular crystal substrate chosen for a SAW device is termed the power flow angle (PFA). This is a characteristic of anisotropic substrates and is a result of the fact that the phase velocity of the surface wave is asymmetric about the propagation direction. The major problem which arises is that the acoustic beam may steer off of the desired propagation track, missing the output transducer unless it is properly designed.

The power per unit width carried in a surface wave is found by integrating the mechanical and electrical Poynting vectors to obtain $$P_i = -\tfrac{1}{2}Re\left\{ \int_{-\infty}^{0} T_{ij}\mu_j^* dx_3 - i \int_{-\infty}^{\infty} \phi D_i dx_3 \right\}, i=1,2$$

where $\mu_j$ is the particle displacement, $T_{ij}$ the stress tensor, $\phi$ the electric potential, and $D_i$ the electric displacement. At least some of these terms are temperature sensitive. $P_1$ gives the power flow perpendicular to the wave front and $P_2$ gives the power flow parallel to the wave front. $P_3=0$ for the Rayleigh wave which is confined to the surface. The power flow angle, which also varies with temperature, may be defined as $$\theta = \arctan(P_2/P_1) \approx P_2/P_1, \text{ for } P_2 << P_1$$

Power flow angles as high as 20 degrees are not uncommon on quartz.

Figure 2:
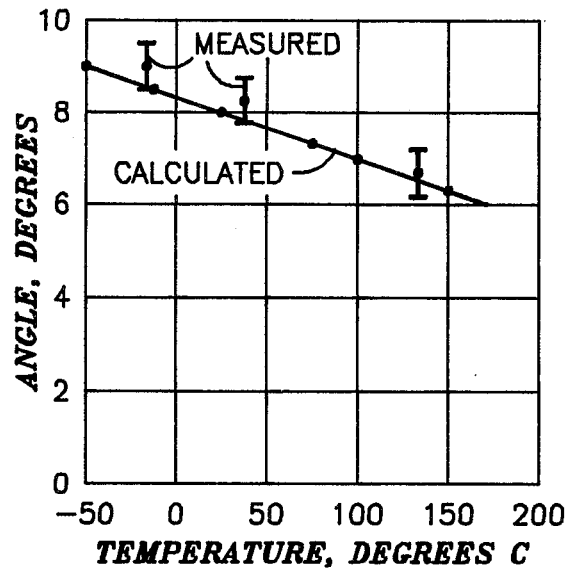
FIG. 2 is a graph of calculated and measured power flow angles at various temperatures for the quartz cut (YXwlt) 14.283/39.117/40.6.

Prior art SAW devices are designed without knowledge of the fact that the PFA is generally a function of temperature. An example of a substrate showing a rather high variation of PFA over a temperature range of $-50°$ C. to $150°$ C. is the doubly rotated cut of quartz specified by (YXwlt) 14.283/39.117/40.6. (See "Standards on Piezoelectric Crystals 1949", supra.) FIG. 2 is a graph of the calculated and measured PFA for this cut as a function of temperature. For this cut, a variation in PFA of nearly 3 degrees is observed, and the function is in good agreement with calculations. This agreement makes possible the design of an improved SAW device with a unique output transducer geometry which compensates for temperature dependent device response. It should be noted that the PFA is non-zero over the entire temperature range, so that any device built on this cut must account for the fact that the acoustic beam power will not flow perpendicular to the transducer electrodes.

Figure 3:
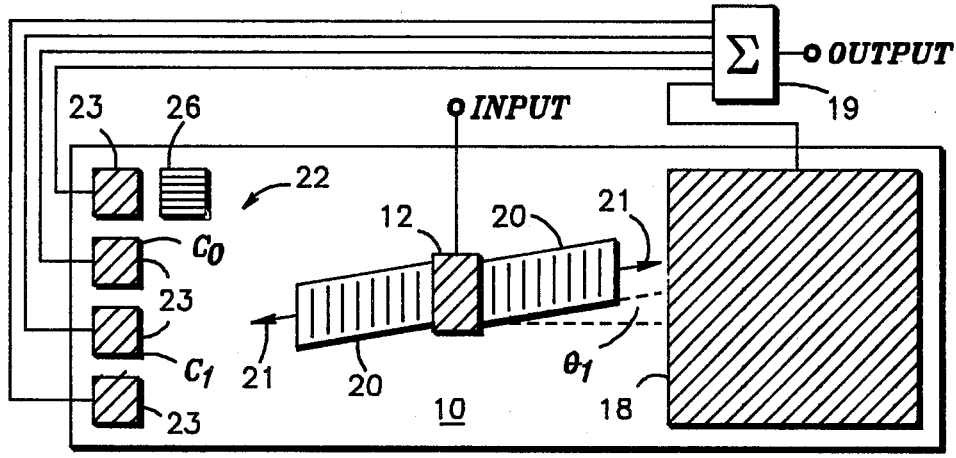
FIG. 3 is a diagram of a preferred embodiment of the present invention.

FIG. 3 is a diagram of a preferred embodiment of this invention which utilizes the variation in PFA to provide a temperature stable response. Substrate 10 is chosen so as to provide a relatively large variation in PFA to allow manageable transducer sizes. The cut referred to above is typical. Conventional input transducer 12 and primary output transducer 18 are applied to substrate 10. As will be apparent, a narrow beam is highly desirable in this invention, so conventional input beam compression techniques are utilized. Primary output transducer 18 may be somewhat broadened in the vertical direction to intercept beam 20 over the entire range of PFA, $\theta$. As shown, beam 20 is effectively "steered" in direction 21, which corresponds to a PFA of $\theta_1$. In this embodiment, beam 20 is seen also to propagate away from primary output transducer 18, toward array 22 of compensators 23 which are individual output transducers arranged along the vertical direction and individually connectable to an external circuit. For purposes of clarity, compensators 23 are shown relatively large and physically separated. Actual devices may use relatively small compensators spaced very closely or even as a continuous structure. The total response of this device is not solely the response of primary output transducer 18, but a combination of that response plus the response of one or more compensators 23. This response is obtained by connecting each of the compensators 23 and primary output transducer 18 to summing circuit 19. The details of this combination are best understood by reference to FIGS. 4A and 4B.

A response of primary output transducer 18 at some nominal temperature, say $T_0$, is chosen as the desired response of the device. In the simplest case, the external circuit ignores the response of the particular compensator, say $C_0$, illuminated by beam 20 at temperature $T_0$. The sum response of the device at $T_0$ is represented by a vector in FIG. 4A. The aim of this invention is to produce a sum response at other temperatures which is as nearly equal to this vector as possible. As the temperature changes to some new value, say $T_1$, beam 20 is "steered" to illuminate a different compensator, say $C_1$, and the phase of the response at primary output transducer 18 changes, as shown in FIG. 4B. Without some additional response from compensator $C_1$, the device would be temperature instable. So compensator $C_1$ must be designed to produce a response which can be added to the response of primary output transducer 18 in the external circuit and which compensates for the phase shift. Either by placement of the compensator or by external circuits, the response of each compensator 23 is shifted 90° in phase with respect to the response of primary output transducer 18. If the phase angle between the desired response and the shifted response at $T_1$ is small, the precise angle required between the phase of the shifted response and the compensator response will very nearly be 90°. The magnitude of response required from each compensator may be achieved by design of the compensator or by external circuits.

The precision with which the sum response of a device using this invention is stabilized will depend on a number of design considerations. A limiting factor is the extent of accurate theoretical knowledge of the propagation of surface acoustic waves on various substrates. Problems such as diffusion of the beam limit the ability of the designer to predict the response of a particular transducer geometry.

One possible design approach is to accurately measure the separate responses of a primary output transducer and a compensator array over the desired temperature range. With this knowledge an external circuit may be designed which makes small adjustments to the compensator responses and provides the final sum response. However, cost and other factors provide strong incentive toward design of a compensator response which merely needs to be summed with the primary response to achieve a temperature stable sum response.

If the designer knows the details of propagation of surface waves in complete theoretical rigor, it is possible to design a SAW device based on this invention entirely from that knowledge. In the extreme case, a single output transducer having non-linear electrodes may be designed such that the phase variations of the output signal as the acoustic beam sweeps across the transducer precisely cancel the phase variations caused by temperature change. As is apparent, such a device is not conceptually different from the device of FIG. 3, since the phase compensation provided by the compensators of FIG. 3 is simply built into the single output transducer.

In any case, the geometry of the output transducers along the vertical dimension may be determined by the variation in PFA over the temperature range, which is obtainable both empirically and theoretically. In the case of the preferred embodiment, this geometry is the angular size and structure of the compensators. Other techniques may be used to vary device response as the PFA changes. For instance, an acoustic absorber 26 (see FIG. 3) may be placed to partially or totally shield a portion of compensator array 22. This will vary the illumination of array 22 by surface acoustic waves as the PFA varies.

Figure 5:
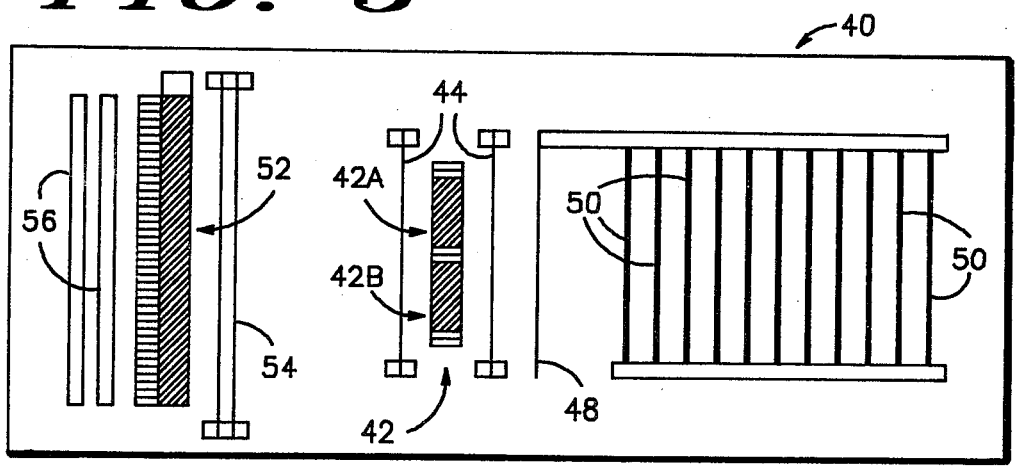
FIG. 5 is a plan view of a mask used in fabricating SAW devices according to the present invention on various crystal cuts for experimental purposes.

FIG. 5 is a plan view of a computer-drawn mask 40 used to fabricate SAW devices according to the principles of the present invention on various crystal cuts for experimental purposes. As will be apparent from the description below, mask 40 while embodying the principles of the invention, has various features which suit it for experimental use and which would be unnecessary in many applications. For example, input transducer 42 has two sections 42a and 42b, each of which is a complete SAW transducer. This is necessary because the angle at which the acoustic beam propagates with respect to the transducer electrodes is depends on the particular crystal cut utilized. Since mask 40 is intended to be used on various cuts, a single input transducer would not always fully illuminate the other transducers on all cuts. After fabrication, one of sections 42a and 42b is chosen and used as the input transducer. Each of the sections 42a and 42b has an (width) aperture of 36 mils and comprises 40 pairs of double electrodes. Each double electrode comprises two parallel metal lines 0.06 mils wide and spaced apart by 0.06 mils, thus giving an acoustic wavelength of 0.48 mils. The double electrode configuration is used to reduce spurious signals caused by reflections. On the scale of FIG. 5, it is impossible to reproduce features as small as the individual electrodes, so they are represented by the shaded regions. Sections 42a and 42b are designed to operate at a frequency of approximately 260 MHz.

On either side of input transducer 42 are ground bars 44 which comprise metal lines to be connected to the ground side of the electrical circuit to reduce capacitive coupling between the transducers. Output transducer 46 comprises a ground bar 48 and 11 electrode sets 50. Each set 50 comprises 4.5 pairs of double electrodes with line width and electrode spacing of 0.06 mils. Sets 50 are separated by 19.2 mils, which coincides with the length of each input transducer section 42a and 42b. The width (aperture) of output transducer 46 is 120 mils.

Compensator array 52, which is separated from input transducer 42 by a double ground bar 54 comprises thirty closely spaced transducers each with a width (aperture) of approximately 6.5 mils. Again the details are too small to be reproduced at this scale, but will be more clearly described with reference to FIG. 5A. Each individual transducer in array 52 has 40 pairs of double electrodes with a line width and spacing of 0.06 mil. The total width of array 52 is approximately 200 mils. Behind compensator array 52 are two bars 56 of an acoustic absorbing material such as RTV silicone rubber.

FIG. 5A is an enlarged view of a portion of mask 40 showing the detail of a portion of compensator array 52. The individual electrodes are drawn as single electrodes instead of double electrodes for simplicity. A first bonding pad 60 and interconnection line 62 serve to provide a ground or common connection to each of the individual transducers or compensators, which are designated $C_1$ through $C_{30}$, consecutively. An acoustic beam 36 mils wide will only illuminate all or part of six compensators at any one time and the few degrees of beam travel expected will sweep the beam over only part of the entire compensator array. The large size of array 52 is another concession to the need to use mask 40 on various crystal cuts. Each compensator also has a second bonding pad 66 for connecting its signal output to the external summing circuit.

Referring now to FIG. 6A, a portion of a SAW device according to the present invention is shown in simplified diagram form. A compensator array 70 is constructed according to the description of FIGS. 5 and 5A above. At a temperature $T_0$, an acoustic beam 72 illuminates a portion of compensator array 70. Acoustic beam 72 has a width $W_M$, which is determined primarily by the width of the input transducer. An acoustic absorber 74, such as RTV silicone rubber intercepts a portion of beam 72 so that compensator array 70 is illuminated by a beam width $W(T_0)$. Since the amplitude of the output response for a given crystal cut and transducer set at a particular temperature T is simply a function of the width of illuminated portion of the output transducer, it is possible to state that:

$$A(T) = A_M \frac{W(T)}{W_M};$$

where $A_M$ is the amplitude when the full acoustic beam, which has a width $W_M$, falls on the output transducer.

Referring now to FIG. 6B, the output of each of the transducers is represented as a vector comprising a magnitude and a phase angle. $\vec{P}(T_0)$ represents the output of the primary output transducer, $\vec{C}(T_0)$ represents the output of compensator array 70 and $\vec{R}(T_0)$ represents the sum, or resultant, of the two. In other words, $$\vec{R}(T_0) = \vec{P}(T_0) + \vec{C}(T_0).$$

The phase angle of $\vec{R}(T_0)$ is represented by $\phi$. It is this value, $\phi$, which must be held constant to achieve temperature stability. Variations in the magnitude of R are not as important.

Referring now to FIG. 7A, the same device is shown at a different temperature $T_1$. Acoustic beam 72 has changed direction by an amount calculatable from the equations on page 6 or from data such as is shown in FIG. 2. A greater portion of beam 72 is blocked by absorber 74, thus the width $W(T_1)$ of the beam which illuminates compensator array 70 is less than $W(T_0)$. It follows that $A(T_1)$ is less than $A(T_0)$.

Referring now to FIG. 7B, it is apparent that the change in temperature resulted in a phase shift of $\Delta\phi(T_1)$ in both $\vec{P}(T_1)$ and $\vec{C}(T_1)$ when compared to their phases at $T_0$. Thus, absent some compensation, $\vec{R}(T_1)$ will be phase shifted to the position shown. But the presence of compensator array 70 and absorber 74 allows a change in the magnitude of the compensator response. The magnitude of the change, $\Delta\vec{C}(T_1)$, is simply that necessary to restore the phase of the final resultant, $\vec{R}_C(T_1)$ to $\phi$, as shown. The case of FIGS. 7A and 7B demonstrates the use of "negative compensation". In other words, the phase of $\Delta\vec{C}(T_1)$ is 180° from that the $\vec{C}(T_1)$. This change is accomplished simply by decreasing the magnitude of the compensator response.

It is possible to empirically or theoretically obtain $\Delta\phi(T)$ from well known calculations of the variation of the velocity of surface acoustic wave beam 72 as a function of temperature. Thus, $\Delta\vec{C}(T)$ may be found graphically, as in FIG. 7B, or by calculation. Since $\Delta\vec{C}(T)$ is simply a change in magnitude, it may be expressed as:

$$\Delta C(T) = A(T) - A(T_0).$$

For instance, in the case illustrated in FIGS. 7A and 7B, $$\Delta C(T_1) = \frac{A_M}{W_M}(W(T_1) - W(T_0)).$$

Now the difference in widths of the two acoustic beams is a simple function of the change in beam angle, which can be found as described in relation to FIG. 2, and the distance between the input transducer and absorber 74. Thus, knowing the PFA as a function of temperature and $\Delta C(T)$ allows the final device geometry to be precisely calculated. As is apparent, the use of acoustic absorber 74 is only one method of providing the necessary change in the magnitude of the response of compensator array 70. Since array 70 is comprised of a plurality of individually connectable compensators, it is also possible to disconnect certain of the compensators to produce the same result.

Referring now to FIGS. 8A and 8B, the case of "positive compensation" is illustrated. At a temperature $T_2$ acoustic beam 72 has steered away from absorber 74 so that $W(T_2) = W_M$. Since $W(T_2)$ is greater than $W(T_0)$ the sign of $\Delta C(T_2)$ is positive. This is required since the sign of $\Delta\phi(T_2)$ is the opposite of that of $\Delta\phi(T_1)$. As before, the magnitude of $\Delta C(T_2)$ is chosen so that the final compensator response at $T_2$, that is $\vec{C}(T_2) + \Delta\vec{C}(T_2)$, when added to $\vec{P}(T_2)$ results in $\vec{R}_C(T_2)$ which has the same phase $\phi$ as $\vec{R}(T_0)$. It should be noted that both $\vec{R}_C(T_1)$ and $\vec{R}_C(T_2)$ have different magnitudes than $\vec{R}(T_0)$.

Figure 9:
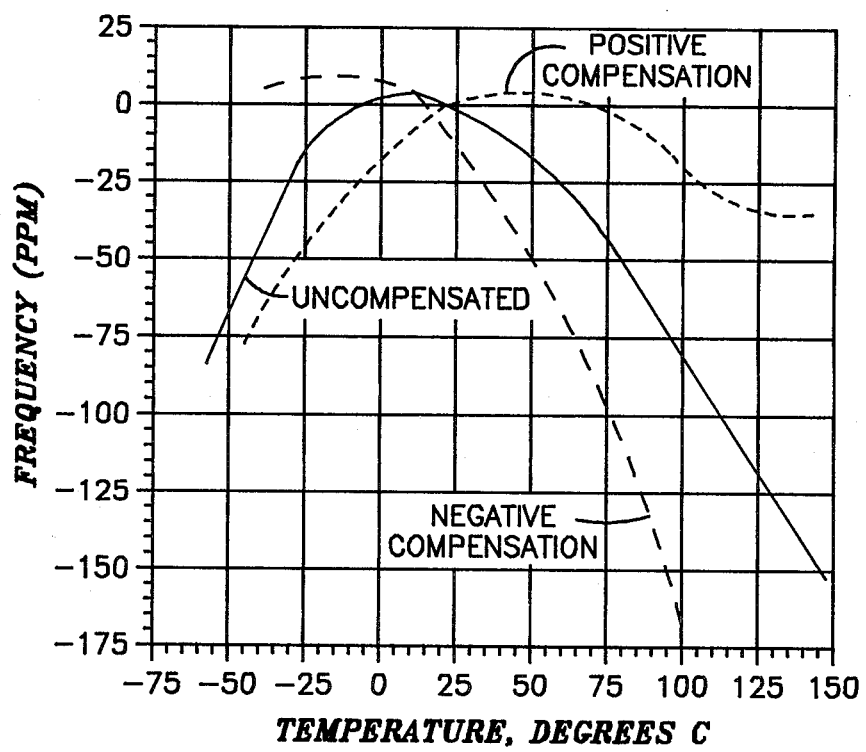
FIG. 9 is a graph of several responses of a device according to FIG. 5.

Referring now to FIG. 9, a graphic representation of the output of a device fabricated using the mask of FIG. 5, the effect of compensation according to the present invention is shown. As is typical, the stability of the device is measured as a change in frequency (in parts per million), which is plotted as the ordinate with temperature (in degrees C) as the abscissa. The solid curve represents the uncompensated output of the primary transducer when fabricated on the quartz cut (YXwlt) 14.310/41.867/40.5. The dashed curve, which represents the output of the device with negative compensation or gradually decreasing compensator output, is much more stable than the uncompensated output at low temperature, but less stable at high temperature. The opposite is true of the dotted curve, representing the output of the device with positive compensation. As is apparent, a combination of the two would yield a relatively temperature stable device.

This mask shown in FIG. 5 and described above is intended to produce experimental devices, not to obtain the maximum stability possible using the principles of the present invention. However, it does illustrate those principles and is a useful tool in developing very stable devices through accurate prediction of power flow angles, amounts of compensation required and other factors. Furthermore, it is only one example of a device in which the geometry of one of the output transducers is exploited in combination with a known PFA variation to obtain a temperature stable output.

While this invention discusses only those cases where compensation is provided for in the output transducer, it will be clearly understood that SAW devices are bilateral and that the compensated transducer may be used for an input terminal.

While the invention has ben particularly shown and described with reference to a preferred embodiment thereof, it will be understood by those skilled in the art that various other modifications and changes may be made to the present invention from the principles of the invention described above without departing from the spirit and scope thereof, as encompassed in the accompanying claims. Therefore, it is intended in the appended claims to cover all such equivalent variations as come within the scope of the invention as described.

We claim:

1. A temperature stable SAW device comprising:
   a substrate having a known power flow angle variation as a function of temperature;
   first means for generating surface acoustic waves on a surface of said substrate in response to a first electrical signal; and
   second means for generating at least one responsive electrical signal in response to said surface acoustic waves, said second means having a geometry such that said power flow angle variation provides compensation for temperature dependent changes in said substrate.

2. The device according to claim 1 wherein one of said first and second means comprises:
   primary means for generating a primary responsive signal having a phase which varies in response to said temperature dependent changes in said substrate; and
   compensator means for generating at least one compensating responsive signal, said compensator means having a geometry such that said at least one compensating responsive signal compensates for said varying phase of said primary responsive signal.

3. The device according to claim 1 wherein one of said first and second means comprises:
   a plurality of interdigitated fingers, said geometry further comprising a non-linearity of said fingers such that distances traversed by said surface acoustic waves varies in response to said power flow angle variation.

4. The device according to claim 2 further comprising:
   means for absorbing surface acoustic waves, said absorbing means being placed on said substrate such that said second means for varyingly illuminated by said surface acoustic waves as said power flow angle varies.

5. A temperature stable SAW device comprising:
   a substrate having a known power flow angle variation as a function of temperature;
   first means for generating surface acoustic waves on a surface of said substrate in response to a first electrical signal; and
   second means for generating a temperature compensated output signal, said output signal being responsive to said power flow angle variation.

6. The device according to claim 5 wherein one of said first and second means comprises:
- primary means for generating a primary responsive signal having a phase which varies as a function of temperature;
- compensator means for generating at least one compensating responsive signal, said at least one compensating responsive signal being responsive to said power flow angle variation; and
- means for summing said primary responsive signal and at least one of said at least one compensating responsive signal to obtain said temperature compensated output signal.

7. The device according to claim 5 wherein one of said first and second means comprises:
- a plurality of interdigitated fingers having a geometric relationship with said input means such that distances traversed by said surface acoustic waves varies in response to said power flow angle variation.

8. The device according to claim 6 further comprising:
- means for absorbing surface acoustic waves, said absorbing means shielding at least a portion of said output means from said input means.

9. In a SAW device having a substrate which has a known power flow angle variation as a function of temperature and input means on the substrate for generating surface acoustic waves, a method of producing a temperature compensated output signal comprising the steps of:
- generating surface acoustic waves by use of said input means; and
- receiving said surface acoustic waves and generating an output signal by use of output means which have a geometry such that said power flow angle variation produces a phase shift of said output signal approximately equal and opposite to a phase shift produced by a temperature change.

* * * * *